United States Patent
Kailasam

(10) Patent No.: US 7,425,506 B1
(45) Date of Patent: Sep. 16, 2008

(54) METHODS OF PROVIDING AN ADHESION LAYER FOR ADHESION OF BARRIER AND/OR SEED LAYERS TO DIELECTRIC FILMS

(75) Inventor: Sridhar K Kailasam, Fremont, CA (US)

(73) Assignee: Novellus Systems Inc., San Jose, CA (US)

( * ) Notice: Subject to any disclaimer, the term of this patent is extended or adjusted under 35 U.S.C. 154(b) by 568 days.

(21) Appl. No.: 10/847,522

(22) Filed: May 17, 2004

Related U.S. Application Data

(63) Continuation of application No. 10/342,522, filed on Jan. 15, 2003, now Pat. No. 6,974,768.

(51) Int. Cl.
*H01L 21/00* (2006.01)

(52) U.S. Cl. .................. 438/694; 438/700; 438/706; 438/710

(58) Field of Classification Search .......... 438/694, 438/706, 710
See application file for complete search history.

(56) References Cited

U.S. PATENT DOCUMENTS

| | | | |
|---|---|---|---|
| 6,251,759 B1 * | 6/2001 | Guo et al. ............... | 438/584 |
| 6,294,458 B1 | 9/2001 | Zhang et al. | |
| 6,362,099 B1 | 3/2002 | Gandikota et al. | |
| 6,365,502 B1 | 4/2002 | Paranjpe et al. | |
| 6,461,909 B1 | 10/2002 | Marsh et al. | |
| 6,462,367 B2 | 10/2002 | Marsh et al. | |
| 6,498,091 B1 * | 12/2002 | Chen et al. ............... | 438/627 |
| 6,974,768 B1 * | 12/2005 | Kailasam ................. | 438/625 |
| 2002/0009880 A1 * | 1/2002 | Jiang et al. ............... | 438/643 |
| 2002/0192948 A1 * | 12/2002 | Chen et al. ............... | 438/643 |

OTHER PUBLICATIONS

J. A. Kerr in CRC Handbook of Chemistry and Physics 1999-2000: A Ready-Reference Book of Chemical and Physical Data, CRC Handbook of Chemistry and Physics, D.R. Lide, (ed.), CRC Press, Boca Raton, Florida, USA, 81 1st edition, 2000. (Copy not Submitted).

* cited by examiner

*Primary Examiner*—Shamim Ahmed
(74) *Attorney, Agent, or Firm*—DeLio & Peterson, LLC; Robert Curcio

(57) ABSTRACT

A process for enhancing the adhesion of directly plateable materials to an underlying dielectric is demonstrated, so as to withstand damascene processing. Using diffusion barriers onto which copper can be deposited facilitates conventional electrolytic processing. An ultra-thin adhesion layer is applied to a degassed, pre-cleaned substrate. The degassed and pre-cleaned substrate is exposed to a precursor gas containing the adhesion layer, optionally deposited by a plasma-assisted CVD process, resulting in the deposition of an adhesion layer inside the exposed feature. The treated wafer is then coated with a diffusion barrier material, such as ruthenium, so that the adhesion layer reacts with incoming diffusion barrier atoms. The adhesion layer may be selectively bias-sputter etched prior to the deposition of the diffusion barrier layer. A copper layer is then deposited on the diffusion barrier layer.

18 Claims, 5 Drawing Sheets

DEGASSED AND PRE-CLEANED SUBSTRATE

ADHESION DEPOSITION: Ru DEPOSITION

BIASED SPUTTER-ETCH TO REMOVE Si FROM THE BOTTOM OF THE FEATURE

Ru DEPOSITION

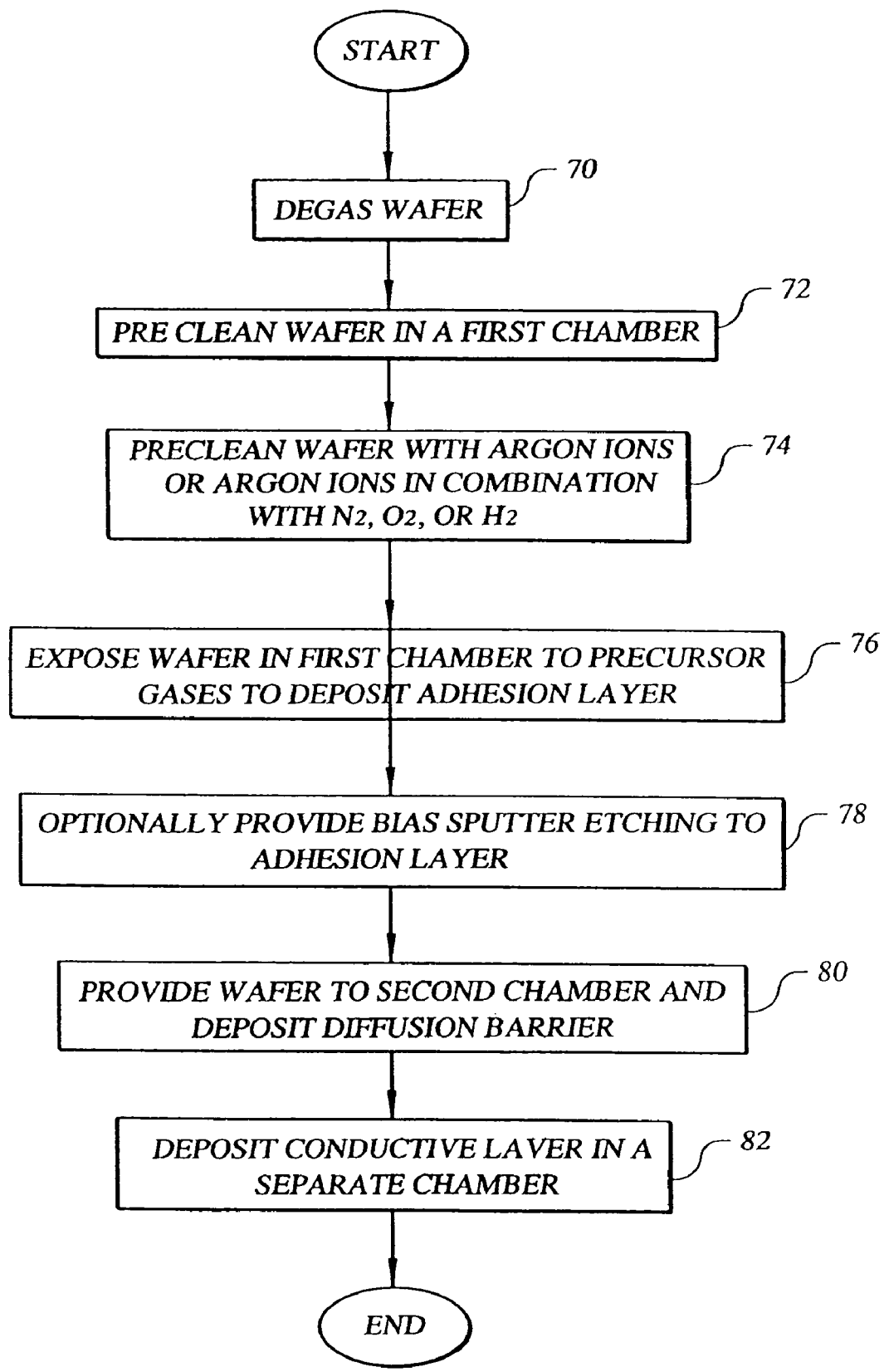

METHODS OF PROVIDING AN ADHESION LAYER FOR ADHESION OF BARRIER AND/OR SEED LAYERS TO DIELECTRIC FILMS

This is a continuation of application Ser. No. 10/342,522 filed on Jan. 15, 2003 now U.S. Pat. No. 6,974,768.

BACKGROUND OF THE INVENTION

1. Field of the Invention

The present invention relates to methods of processing a semiconductor wafer in a deposition chamber to provide copper vias and trenches, and more particularly, to a method of processing a semiconductor wafer in a deposition chamber including the deposition of an adhesion layer for a barrier material.

2. Description of Related Art

Integrated circuit (IC) manufacturers have traditionally used aluminum and aluminum alloys, among other metals, as the conductive metal for interconnects in integrated circuits. However, concerns exist as to the ability of aluminum-based interconnect metallization to meet the demands of future IC designs requiring high circuit density. In recent years, IC manufacturers have turned to copper to replace aluminum and aluminum alloys for advanced microelectronic applications. This is because copper has a higher conductivity that translates to significant improvement in the interconnect performance. In addition, copper-based interconnects offer better electromigration resistance than aluminum, thereby improving the interconnect reliability. However, the implementation of copper faces certain challenges. For example, the adhesion of copper (Cu) to silicon dioxide ($SiO_2$) and to other dielectric materials is generally poor due to the low enthalpy of formation of the associated Cu compounds. Poor adhesion results in the delamination of Cu from adjoining films during the manufacturing process. Also, Cu ions readily diffuse into $SiO_2$ under electrical bias, and increase the dielectric electrical leakage between Cu lines even at very low Cu concentrations within the dielectric. In addition, if copper diffuses into the underlying silicon where the active devices are located, device performance can be degraded. Copper behaves as a defect in silicon resulting in the reduction of minority carrier lifetime, and hence, results in device degradation. Furthermore, copper will also react with silicon at relatively low temperature to form copper silicides, which increases contact resistance.

The development of Damascene processing has enabled the implementation of copper into interconnect metalization. It is often a preferred method because it requires fewer processing steps than conventional methods and offers higher yields. Damascene processing involves formation of inlaid metal lines in trenches and vias formed in a dielectric layer. Conductive materials, such as copper, are deposited in different and non-contiguous planes. The pathways that join various layers of conductors are referred to as vias, whereas the conductors within a layer are referred to as trenches. Insulators between trenches are called inter-metal dielectric (IMD) and the insulating layers separating planes of conductive material are referred to as the interlevel dielectric (ILD).

The problem of the high diffusivity of copper in silicon dioxide ($SiO_2$), and in other IMDs/ILDs, remains of great concern. To deal with this issue, an integrated circuit substrate must be coated with a suitable barrier layer that encapsulates copper and blocks diffusion of copper atoms. The diffusion barrier, comprising both conductive and non-conductive materials, is typically formed over a patterned dielectric layer and prior to deposition of copper. The time, materials, and process complexity required to form a separate diffusion barrier layer introduces a significant cost to the overall fabrication procedure. Also, the thickness of the barrier, if too great, can create problems with subsequent copper coatings and filling of ultra-fine features—e.g. a sub-100 nm diameter via. Typical barrier materials tend to be much less conductive than copper. Hence, if the barrier inside a sub-100 nm diameter via is too thick, it reduces the available volume of copper within the features leading to increased resistance of the via that could offset the advantage offered by the use of copper. For instance, the International Technology Roadmap for Semiconductors requires that at the 45 nm node the barrier for copper at the intermediate wiring level be limited to 5 nm.

A typical Damascene process flow begins with formation of pathways in a previously formed dielectric layer. Dielectric surfaces to which the invention is applicable preferably include at least one of silicon dioxide, silicon nitride, silicon oxynitride, fluorinated silica glass, CORAL™ from Novellus Systems, Inc., BLACK DIAMOND™ from Applied Materials, Inc., SiLK™ from Dow Corning, Inc., and NANOGLASS™ of Nanopore, Inc, and the like. These pathways may be etched as trenches and vias in a blanket layer of dielectric such as silicon dioxide. The pathways define conductive routes between various devices on a semiconductor wafer. Copper provides the conductive paths of the semiconductor wafer. The adjacent dielectric layer and silicon devices must be protected from copper ions that might otherwise diffuse into the dielectric layer and/or silicon. To accomplish this, the process optionally includes depositing a thin diffusion barrier layer before deposition of copper. Typical materials for the diffusion barrier layer include tantalum (Ta), tantalum nitride ($TaN_x$), tungsten (W), titanium (Ti), titanium nitride (TiN), and the like. Conventional barrier layers are typically formed by a physical vapor deposition (PVD), chemical vapor deposition (CVD), or atomic layer deposition (ALD) process. Preferably, the diffusion barriers formed on integrated circuit substrates are made between about 1 and 30 nm thick.

Electrolytic deposition methods are used to fill the conductive pathways with copper. Before inlaying the line paths with electrolytic deposition of copper, a conductive surface coating must be applied on top of the barrier layer because conventional barrier materials exhibit high electrical resistivity and hence, cannot transport current during electrolytic copper plating. Typically, a copper seed layer is deposited on the barrier layer. Usually, a PVD process deposits this seed layer. Next, a much thicker layer of copper is deposited on the seed layer by electroplating. After deposition of the copper is completed, the copper is planarized, generally by chemical mechanical planarization (CMP) and/or electropolishing down to the dielectric in preparation for further processing. Finally, a dielectric barrier layer, such as silicon nitride, is applied over the surface thereby encapsulating the exposed copper and dielectric surfaces. In subsequent processing, a newly laid inter-level dielectric layer is etched to form another series of via and trench features wherein the vias connect to the underlying copper conductive routes. Once again, a diffusion barrier is deposited on the etched features in the dielectric and is followed by deposition of a copper seed, electroplating, CMP, and deposition of the dielectric barrier. This process is repeated forming layers of electrically connected, but encapsulated, copper conductive routes. Thus, in the final structure, there is a diffusion barrier between adjoining copper conductive routes.

Although diffusion barriers can be broadly categorized as conductive and non-conductive, the conventional materials (mentioned above) used for diffusion barriers are often ten times to one hundred times as electrically resistant as the copper routes that they encapsulate. The continuing trend towards smaller features size in ICs requires that the thickness of the diffusion barrier also be reduced in order to minimize the contribution of electrical resistance of conventional diffusion barriers. Thus, the replacement of conventional diffusion barriers with newer materials that have reduced electrical resistance is appealing. This is because it would further improve the conductivity in the lines and vias, thereby increasing the speed of signal propagation compared to interconnect structures using conventional barriers. Furthermore, electrolytic plating of copper directly onto conductive barrier materials precludes the use of a separate copper seed layer, thereby simplifying the overall process. Amongst various candidate materials that could serve as directly plateable diffusion barriers, the use of ruthenium (Ru) and its compounds, such as ruthenium oxide ($RuO_x$), is shown herein to be beneficial. Ruthenium and its oxide are known to be good diffusion barriers to copper migration. In addition, electrochemical deposition of copper onto ruthenium is known to be feasible.

However, the use of ruthenium and its compounds as diffusion barriers presents a few challenges. One of the critical attributes of any diffusion barrier is its adhesion to the adjoining dielectric material. The adhesion of noble metals such as ruthenium to the dielectric materials (such as $SiO_2$) is poor, leading to mechanical instabilities during further processing. It would be desirable to determine a process wherein the adhesion of the directly plateable barrier material to the underlying dielectric is improved greatly so as to withstand damascene processing.

Bearing in mind the problems and deficiencies of the prior art, it is therefore an object of the present invention to provide a method of adhering directly plateable barrier materials to an underlying dielectric capable of withstanding damascene processing.

It is another object of the present invention to provide a method of blocking the open pores in dielectric substrates prior to the deposition of the plateable barrier.

Still other objects and advantages of the invention will in part be obvious and will in part be apparent from the specification.

SUMMARY OF THE INVENTION

The above and other objects, which will be apparent to those skilled in art, are achieved in the present invention, which is directed to a method of forming a single layer to serve as a adhesion layer for a diffusion barrier layer in a partially fabricated integrated circuit, the method comprising of: providing a semiconductor wafer having a top surface and a dielectric material including exposed regions accessible from the top surface; degassing the wafer; pre-cleaning the wafer; depositing a first layer to the wafer that would act as an adhesive layer between the exposed regions of the wafer and a diffusion barrier layer; depositing the diffusion barrier layer on top of the first layer; and depositing a conductive material on top of the diffusion barrier layer. The dielectric material comprises at least one of silicondioxide, silicon oxynitride, silicon nitride, fluorinated silica glass, NANOGLASS™, SiLK™, and carbon-doped oxides, of which the carbon-doped oxides include CORAL™, BLACK DIAMOND™, or AURORA™. Pre-cleaning the wafer includes subjecting the wafer to a bombardment of argon ions, or argon ions in combination with hydrogen, helium, oxygen, or nitrogen. The adhesive layer may comprise boron, amorphous silicon, carbon, titanium nitride, or tantalum nitride. The adhesive layer may be deposited at a thickness of less than 100 Å inside the features etched into the dielectric material. The wafer may be subject to a precursor containing the adhesive material for a period of 1 to 100 seconds at a pressure ranging from 0.1 to 100 Torr. The diffusion barrier may comprise ruthenium, cobalt, tungsten, molybdenum, or rhenium. The diffusion barrier is preferably less than 200 Å thick. The diffusion barrier layer includes using organo-metallic precursors for chemical vapor deposition and atomic layer deposition processes. The organo-metallic precursors for ruthenium may include bis(cyclopentadienyl)ruthenium, ruthenium acetylacetonate, tris(2,2,6,6-tetramethyl-3,5-heptanedionate), or ruthenium carbonyl. The substrate may be heated to a temperature of between about 100-400 degrees Celsius after the step of depositing the diffusion barrier layer, causing a reaction between the dielectric material, the adhesion layer, and the diffusion barrier. The conductive metal may be directly deposited on top of the diffusion barrier by electrochemical deposition methods, including electrolytic copper plating or electroless copper plating. A copper seed layer may be directly deposited on top of the diffusion barrier by physical vapor deposition, chemical vapor deposition, or electrochemical methods.

In a second aspect, the present invention is directed to a method of forming an adhesion layer to a dielectric of a semiconductor wafer, comprising: degassing the wafer; pre-cleaning the wafer; exposing the degassed, pre-cleaned wafer to a plasma that includes the adhesive-containing precursor; and depositing a layer of diffusion barrier on the wafer. The diffusion barrier may comprise ruthenium, cobalt, tungsten, molybdenum, or rhenium. Pre-cleaning the wafer includes subjecting the wafer to a bombardment of argon ions, or argon ions in combination with hydrogen, helium, oxygen, or nitrogen. Following the pre-clean step, the wafer is subject to a plasma enhanced chemical vapor deposition process to deposit the adhesive layer. The adhesive layer may comprise boron, amorphous silicon, carbon, titanium nitride or tantalum nitride. The adhesive layer may be deposited at a thickness of less than 100 Å inside the features etched into the dielectric material. The wafer may be subject to a precursor containing the adhesive material for a period of 1 to 100 seconds at a pressure ranging from 0.1 to 100 Torr. For instance, a degassed and pre-cleaned wafer may be exposed to a plasma of silane at 0.1 to 100 Torr pressure for 1 to 100 seconds leading to the formation of amorphous silicon on the exposed surfaces of the wafer. The wafer is held to a maximum temperature of approximately 300° C. during the silane exposure to minimize or preclude reaction between the deposited silicon adhesion layer and the underlying copper at the bottom of the vias. The wafer temperature during the step of depositing ruthenium may be at an elevated temperature of 400° C.

In a third aspect, the present invention is directed to a method of forming an adhesion layer and barrier layer to facilitate copper deposition on a dielectric of a semiconductor wafer, comprising: degassing the wafer; pre-cleaning the wafer; exposing the wafer to deposit an adhesive layer on the wafer; bias-sputter etching the wafer to selectively remove the adhesive layer; and depositing a layer of diffusion barrier on the wafer. The diffusion barrier may comprise ruthenium, cobalt, tungsten, molybdenum, or rhenium. Pre-cleaning the wafer includes subjecting the wafer to a bombardment of argon ions, or argon ions in combination with hydrogen, helium, oxygen, or nitrogen. The adhesive layer may include boron, amorphous silicon, or carbon. The precursors for the said adhesive layers may comprise of diborane gas, silane gas, or methane gas. The substrate may be exposed to such precursors for approximately 1 to 100 seconds at a pressure ranging from 0.1 to 100 Torr. The step of bias-sputter etching may comprise electrically biasing the wafer in the plasma to sputter the adhesive layer selectively from via bottoms, and exposing a clean copper surface prior to barrier deposition. The wafer temperature during the step of depositing ruthenium may be at an elevated temperature of 400° C.

In a fourth aspect, the present invention is directed to a method of forming an adhesion layer and barrier layer to facilitate copper deposition on a dielectric of a semiconductor wafer, comprising: degassing the wafer; pre-cleaning the wafer; exposing the wafer to deposit an adhesive layer on the wafer in the same chamber used for pre-cleaning; an optional step of bias-sputter etching the wafer to selectively remove the adhesive layer in the chamber used for pre-cleaning; and depositing a layer of diffusion barrier in a separate chamber on the wafer. The diffusion barrier may comprise ruthenium, cobalt, tungsten, molybdenum, or rhenium. Pre-cleaning the wafer includes subjecting the wafer to a bombardment of argon ions, or argon ions in combination with hydrogen, helium, oxygen, or nitrogen. The adhesive layer may include boron, amorphous silicon, carbon, titanium nitride, or tantalum nitride. The substrate may be exposed to such precursors for approximately 1 to 100 seconds at a pressure ranging from 0.1 to 100 Torr. An optional sputter etch in the pre-clean chamber may be included following the deposition of the adhesion layer to selectively remove the adhesion layer from the bottom of the vias alone. The wafer temperature during the step of depositing ruthenium may be at an elevated temperature of 400° C.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 8 depicts a flow chart of a second wafer processing sequence using one single chamber for precleaning and deposition of adhesion layer, and a second chamber for deposition of diffusion barrier.

DESCRIPTION OF THE PREFERRED EMBODIMENT(S)

Figure 1:
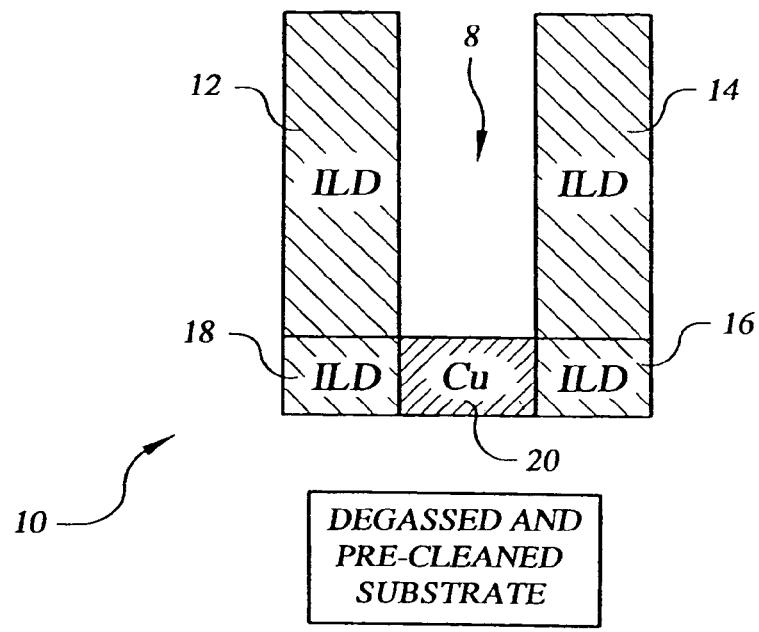
FIG. 1 is a cross-sectional front elevation view of a degassed, pre-cleaned wafer.

In describing the preferred embodiment of the present invention, reference will be made herein to FIGS. 1-8 of the drawings in which like numerals refer to like features of the invention.

In the context of integrated circuit fabrication processes, this invention is typically carried out on a dielectric substrate. The dielectric layer will already have surface features such as vias and channels etched into the dielectric. Also, the substrate will include areas of copper from the completed lower layers.

As discussed above, copper is desirable in IC fabrication for conductive pathways due to its excellent conductivity and reliability. Damascene processing is often a preferred method in copper-based interconnect metallization schemes because it requires fewer processing steps than conventional methods and offers higher yields. However, copper readily diffuses into surrounding dielectric materials and degrades their insulating electrical properties. Hence, diffusion barriers are needed to protect adjoining dielectric materials from copper migration. Before copper can be deposited, the dielectrics must first be protected with a diffusion barrier. Suitable materials for electrically conductive diffusion barriers include tantalum, tantalum nitride, tungsten, titanium, and titanium nitride, to name a few.

A challenge in the manufacture of copper-based interconnects is identifying a material(s) and/or processing that would not only serve as a diffusion barrier to copper migration into the adjoining dielectric layers, but also be amenable to direct copper plating on to itself. This would allow the use of a single layer in place of two materials that separately serve the roles of diffusion barrier and seed layer, thereby resulting in a simpler, cheaper, and more efficient structure.

One characteristic of the directly plateable materials, such as Ru, Co, Mo, W to name a few, is that they are noble and do not readily react with dielectric materials such as $SiO_2$, CORAL™, and other $SiO_2$-based dielectrics. As a result, these candidate barrier materials do not adhere to adjoining dielectric layers. The adhesion problem worsens after a thick copper is electrolytically deposited, which typically leads to delamination of the metallic stack from the underlying dielectric during chemical-mechanical planarization. This invention describes a method to enable the adhesion of ruthenium, a candidate for directly plateable barrier/seed layer, to adjoining dielectric materials. However, the instant invention is not limited to ruthenium, and is also applicable to the use of other barrier/seed candidates that otherwise do not adhere to the typical ILD materials, such as cobalt, tungsten, molybdenum, or rhenium.

The introduction of an ultra-thin adhesion layer to improve the adhesion of the plateable barrier materials to the dielectric is proposed. Prior to the deposition of the adhesion layer and barrier, the incoming wafer is degassed at high temperatures and pre-cleaned. During the pre-clean step, the wafer is subject to bombardment from ions of argon, which may also be in combination with ions from other gases such as hydrogen, helium, oxygen, and nitrogen, among others. The degassed and pre-cleaned wafers are then exposed to a precursor gas for periods ranging from 1 to 100 seconds at pressures ranging from 0.1 to 100 Torr at temperatures ranging from 100 to 400 degrees Celsius. The exposure of the wafer to the precursor gas at high temperature results in thermal decomposition of the precursor leading to the formation of the adhesion layer. Such a process is commonly referred to as thermally-driven chemical vapor deposition (CVD). For instance, exposure of the degassed and pre-cleaned wafer to diborane gas under above-mentioned conditions of temperature, pressure, and duration would result in the formation of boron on the exposed features of the wafer. The boron-coated wafers are then coated with ruthenium so that the boron would react with the incoming ruthenium atoms resulting in the formation of ruthenium-boride ($RuB_x$) that in turn provides for strong adhesion of the ruthenium to the dielectric. The wafer is maintained at an elevated temperature less than or equal to 400° C., and preferably between 100° C. and 400° C. during ruthenium deposition resulting in an in-situ reaction between ruthenium and adhesion layer, thereby eliminating the need for a separate heat treatment. The in-situ reaction, which leads to the adhesion between ruthenium and the dielectric, results in a simpler and less expensive process. However, the reaction between ruthenium and the adhesion layer can be accomplished by annealing the wafer in a separate chamber. Besides boron, other adhesion layers deposited using thermally-driven CVD may include silicon, carbon, titanium nitride, or tantalum nitride. Current literature data of bond enthalpies of neutral heterodiatomic molecules in gas phase suggests that ruthenium bonds well with these species, like it bonds with silicon, as described by J. A. Kerr in CRC Handbook of Chemistry and Physics 1999-2000: A Ready-Reference Book of Chemical and Physical Data, CRC Handbook of Chemistry and Physics, D. R. Lide, (ed.), CRC Press, Boca Raton, Fla., USA, 81 1st edition, 2000. In certain cases, such as with boron or carbon, small concentrations of such species incorporated into copper may result in improved electromigration resistance of copper leading to improved reliability. It has been previously shown that small amounts of boron or carbon segregate along the grain boundaries in copper, which leads to a reduced diffusion of copper along the grain boundaries. This reduced diffusion increases the electromigration resistance of copper. Although not necessary, an optional copper seed layer may be deposited on top of the ruthenium prior to further processing.

In a second preferred embodiment, the degassed and pre-cleaned wafer is exposed to a plasma-assisted CVD process including a precursor gas that results in the deposition of an ultra-thin adhesion layer on the wafer. The adhesion layers deposited using plasma-enhanced CVD may include silicon, boron, carbon, titanium nitride, or tantalum nitride. For instance, exposure of the wafer to a plasma of silane gas would lead to the formation of amorphous silicon (a-Si) film on the wafer. The wafer is subjected to a silane pressure ranging from 0.1 to 100 Torr for periods ranging from 1 to 100 seconds in the plasma. A direct or indirect plasma source may be used to generate the plasma. Furthermore, the wafer may be maintained at an elevated temperature. This plasma-enhanced chemical vapor deposition (PECVD) of silane results in the deposition of a-Si on any exposed feature. Amorphous silicon is deposited on top of the exposed copper inside the vias as it coats the sidewalls of the vias and trenches cut in the dielectric. The deposition of a-Si on top of copper is not desirable because it could result in large increases in contact resistance due to formation of copper-silicides during subsequent high-temperature processing steps. Hence, the temperature of the wafer during exposure to silane is limited to a maximum of approximately 300° C. Following this step, a diffusion barrier layer is deposited, along with a subsequent coating of a conductive material layer, such as copper.

In a third preferred embodiment, the deposition of the adhesion layer is followed by an etch step wherein the wafer is electrically biased in a plasma of argon (Ar) ions in order to create a directional beam of Ar ions. The directional argon ions bombard portions of the wafer that are perpendicular to the ion beam resulting in sputtering of the adhesion layer from top of the exposed copper at the bottom of the vias onto the lower sidewalls of the vias. Not only does the sputter etch remove the adhesion layer from top of the copper, it results in re-deposition of the adhesion layer onto the bottom sidewall of the dielectric where the coverage of the adhesion layer may be poor to begin with due to the limited conformance of the deposition processes, such as PECVD in high aspect ratio features. As a demonstrative example, a 10 to 20 Å PECVD a-Si film deposited on the field or top surface of the wafer results in a thinner layer coating of the sidewalls and the bottom of the features. This thinner layer is on the order of 5 to 10 Å. The silicon on the field and along the sidewalls reacts with ruthenium to provide the desired adhesion. Preferably, after the deposition of a-Si, the wafer is subjected to a biased sputter etch that re-deposits silicon from the bottom of the features onto the sidewalls prior to the ruthenium deposition, thereby leaving a clean interface between ruthenium and copper. It should be noted that the re-sputtering of a-Si should be optimized such that it leaves a clean copper surface inside the vias without fully removing silicon from the bottom of the trenches, where an adhesion layer is needed between the ruthenium and the underlying dielectric. In a similar fashion to the aforementioned embodiments, following this step, a diffusion barrier layer is deposited, and subsequently coated with a conductive material layer, such as copper.

In a fourth preferred embodiment of the present invention, the dielectric surface is pre-cleaned wherein the wafer is subject to bombardment from ions of argon, which may also be in combination with ions from other gases such as hydrogen, helium, oxygen, and nitrogen. The pre-cleaned wafer is then exposed to a precursor gas in the same chamber used for the pre-clean step to deposit the adhesion layer. The adhesion layer may include silicon, boron, carbon, titanium nitride, or tantalum nitride. This will substantially eliminate the need for the soak and etch steps in the process module for ruthenium deposition, thereby simplifying the ruthenium deposition process and hardware requirements. For instance, the pre-clean step using Ar ions may be followed by exposing the wafer to diborane gas resulting deposition of an ultra-thin layer of boron inside the features. The exposure to the precursor gas leading to the formation of the adhesion layer may be followed by a sputter etch to remove the adhesion layer (such as boron) from the bottom of the vias to leave behind a clean copper surface prior to barrier deposition. This strategy is effective if there is exposed copper underneath, as is the case inside vias that would allow for electrolytic copper plating. A second etch must be carefully controlled to leave behind some thickness of the adhesion layer to be left inside the isolated trenches to act as the adhesion layer for subsequent ruthenium deposition. As with the previously described embodiments, a diffusion barrier layer is then deposited, and subsequently coated with a conductive material layer, such as copper.

Thin films of ruthenium may be deposited by a variety of methods including physical vapor deposition (PVD) if the technology is extended for future generations of IC processing. However, deposition of ruthenium using PVD is currently expensive on account of the high cost of manufacturing a sputter-target. Also, PVD processes are very complex to achieve the desired conformality inside the features. Hence, CVD of ruthenium is more attractive. Examples of suitable organo-metallic precursors for chemical vapor deposition of ruthenium include bis(cyclopentadienyl)ruthenium, tris(2,2,6,6-tetramethyl-3,5-heptanedionate) ruthenium, ruthenium acetylacetonate, and ruthenium carbonyl. In addition, CVD films offer much better conformality compared to PVD films.

Furthermore, Ru may be deposited from supercritical fluids using the above-mentioned organo-metallic precursors. An ALD process for ruthenium deposition is also feasible.

Figure 2:
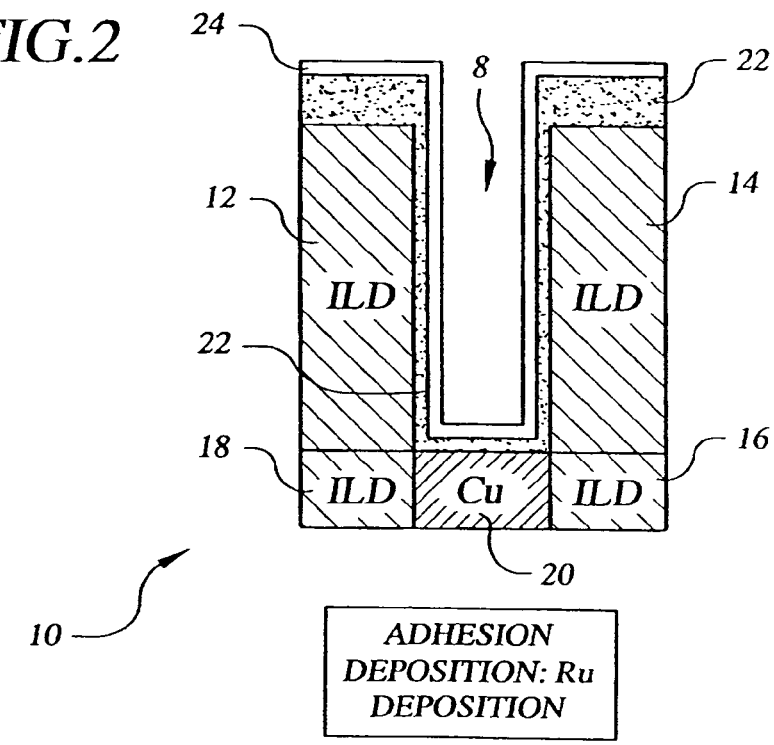
FIG. 2 is a cross-sectional front elevation view of the wafer shown in FIG. 1 with an adhesion layer and a ruthenium layer deposited thereon.

Referring to FIG. 1, in a first embodiment of the present invention, a portion of a dielectric substrate 10 is depicted having interlayer dielectric portions 12, 14, 16, and 18, forming a feature 8, and a copper portion 20. Substrate 10 is degassed and pre-cleaned as described above. FIG. 2 depicts substrate 10 with an adhesion layer 22 deposited thereto and a ruthenium layer 24 deposited on top of the adhesion layer, including the sidewalls of interlayer dielectric portions 12, 14, and over the copper portion 20. The adhesion layer and subsequent diffusion barrier layer may be deposited under normal chemical vapor deposition conditions, or in a second embodiment by a plasma-assisted CVD process. In the second embodiment, wafer 10 is exposed to the plasma-assisted CVD process for the deposition of the adhesion layer 40 and prior to the deposition of a ruthenium layer 42.

Figure 3:
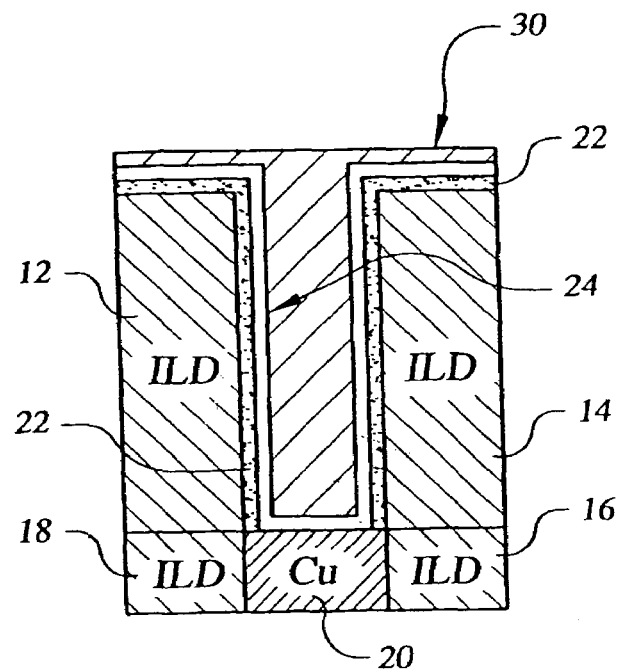
FIG. 3 is a cross-sectional front elevation view of a degassed, pre-cleaned wafer with an adhesion layer, a ruthenium layer, and a direct plated copper film layer.
Figure 4:
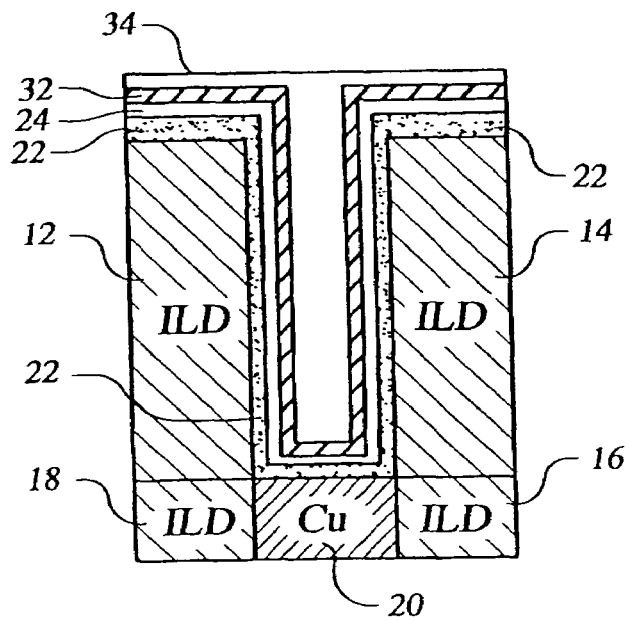
FIG. 4 is a cross-sectional front elevation view of the substrate shown in FIG. 3 having a copper seed layer applied prior to the copper film layer.

Referring to FIG. 3, the preferred embodiment may also include a direct plating of copper (Cu) 30 on the layer of ruthenium 24. Alternatively, a deposition of thin copper seed 32 may be used followed by a second deposition of copper film 34, as shown in FIG. 4. The copper film 34 may then be removed by planarization of the surface leaving the feature filled with copper.

Figure 5:
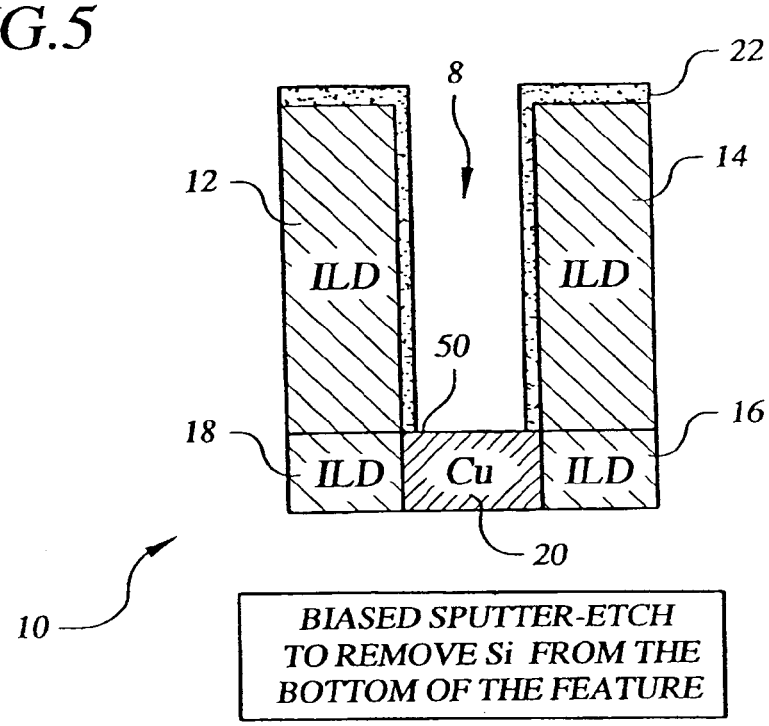
FIG. 5 is a cross-sectional front elevation view of the wafer shown in FIGS. 1-2 with the adhesion layer at the base of the feature removed by sputter etching.
Figure 6:
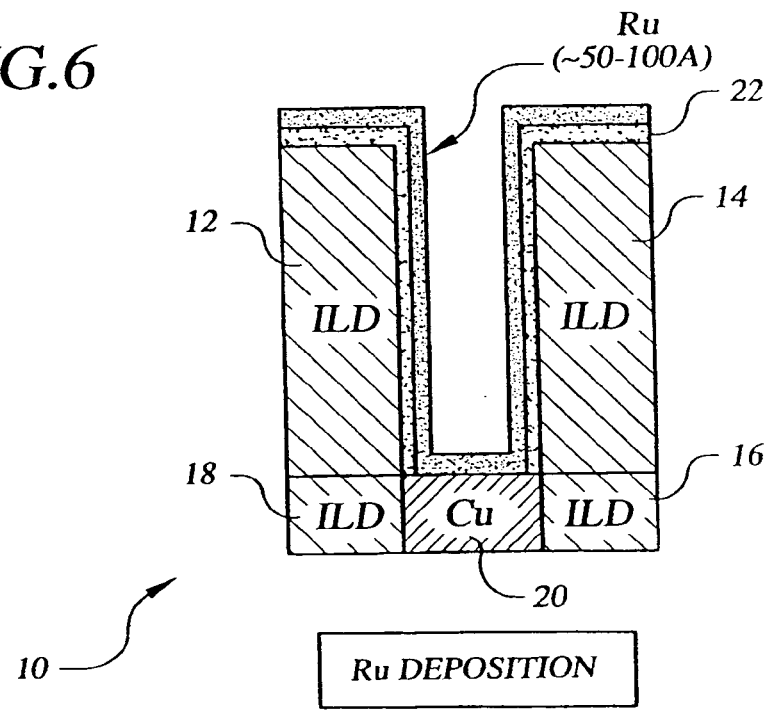
FIG. 6 is a cross-sectional front elevation view of the wafer shown in FIG. 5 with a ruthenium layer applied thereto.

In a third embodiment, the degassed and precleaned wafer 10 has adhesive layer 22 deposited, and is then bias-sputter etched to selectively remove portions 50 of the adhesion layer, as shown in FIG. 5. FIG. 6 depicts the bias-sputter treated wafer with a final ruthenium layer 24 deposited thereon.

Figure 7:
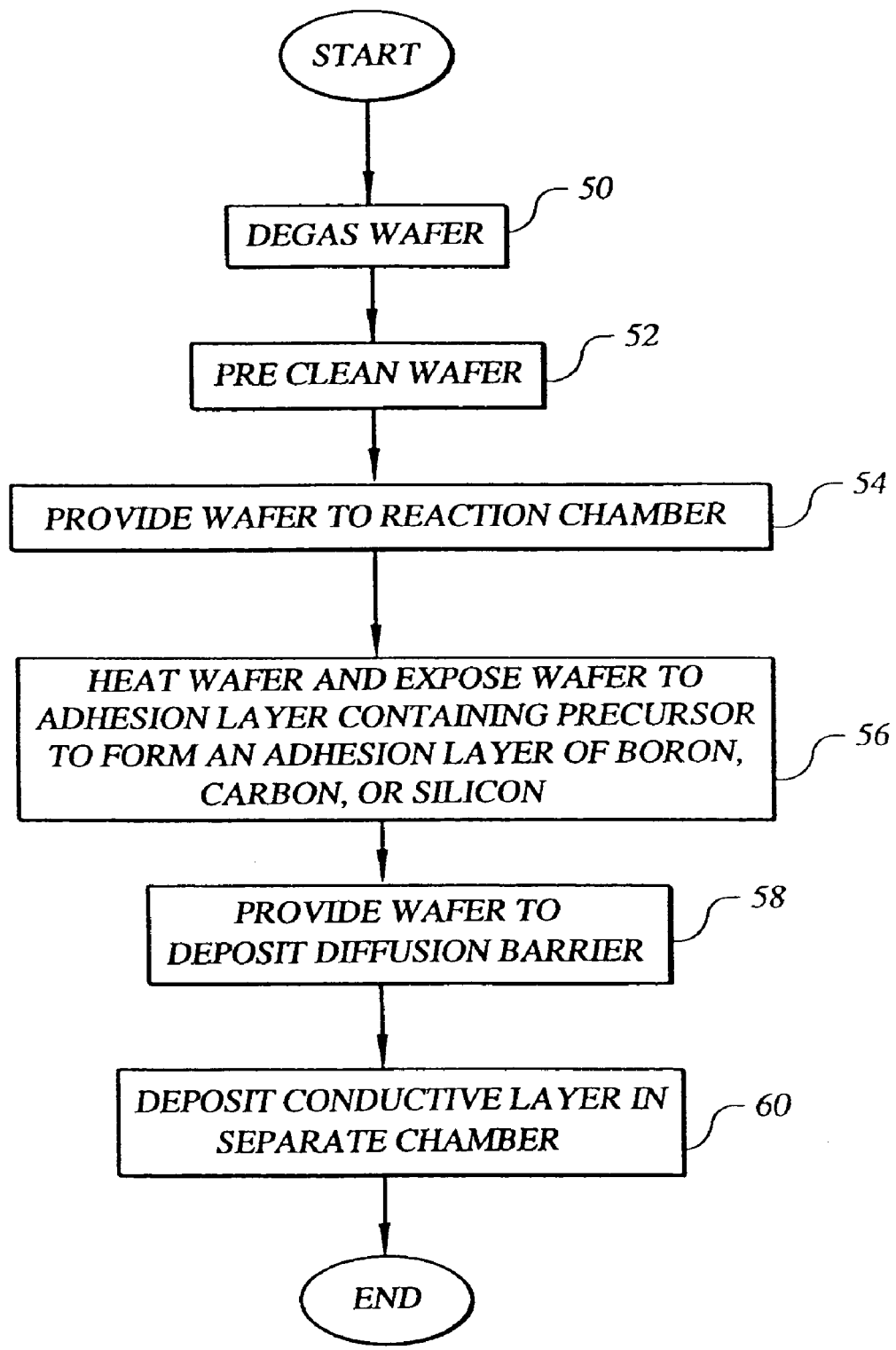
FIG. 7 depicts a flow chart of a first wafer processing sequence using one single chamber for deposition of adhesion layer and diffusion barrier.

In a fourth embodiment, the wafer may also be processed in a separate chamber for deposition of the diffusion barrier. FIGS. 7-8 depict flow charts of the wafer processing sequence. In FIG. 7, the wafer is degassed 50 and precleaned 52 before being provided to a reaction chamber 54. The wafer is then heated and exposed to a precursor 56 to form the desired adhesion layer of boron, carbon, silicon, titanium nitride, or tantalum nitride. Importantly, the deposition of a diffusion barrier occurs in the same chamber used for the deposition of the adhesion layer. Last, a conductive layer is deposited on the adhesion layer 60.

FIG. 8 depicts the process flow of a second wafer processing sequence. As with the first processing sequence, the wafer is degassed 70 and precleaned 72. In this process sequence, the precleaning is performed with argon ions 74 or argon ions in combination with $N_2$, $O_2$, $H_2$, and the like. The wafer is then exposed in the preclean chamber to precursor gases to initiate the deposition of an adhesion layer 76. An optional step of bias sputter etching 78 may then be performed on the wafer at this time. The wafer is then provided to a separate chamber for deposition of a diffusion barrier layer 80. A conductive layer 82 is subsequently added.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a single layer to serve as an adhesion layer for a diffusion barrier layer in a partially fabricated integrated circuit, the method comprising of:
   providing a semiconductor wafer having a top surface including exposed regions accessible from the top surface;
   degassing said wafer;
   pre-cleaning said wafer;
   applying a precursor gas to said wafer at high temperature, said precursor gas including a compound of said adhesion layer;
   depositing said adhesion layer between said exposed regions of the wafer coated with said precursor gas and a diffusion barrier layer, said adhesion layer deposited by a thermally driven chemical vapor deposition process, said diffusion barrier layer comprising ruthenium, cobalt, tungsten, molybdenum, or rhenium, and including organo-metallic precursors;
   depositing said diffusion barrier layer on top of said adhesion layer.

2. The method of claim 1 wherein said organo-metallic precursors include ruthenium based materials.

3. The method of claim 2 wherein said organo-metallic precursors comprise bis(cyclopentadienyl)ruthenium, ruthenium acetylacetonate, tris(2,2,6,6-tetramethyl-3,5-heptanedionate), or ruthenium carbonyl.

4. The method of claim 1 wherein said chemical vapor deposition process comprises a plasma enhanced chemical vapor deposition process.

5. The method of claim 1 wherein said adhesion layer comprises boron, silicon, carbon, titanium nitride, or tantalum nitride.

6. The method of claim 1 wherein said step of providing a semiconductor wafer includes providing a dielectric material layer.

7. The method of claim 6 wherein the dielectric material comprises at least one of silicon dioxide, silicon oxynitride, silicon nitride, fluorinated silica glass and a low-k dielectric material.

8. The method of claim 6 wherein said dielectric material includes carbon-doped oxides.

9. The method of claim 6 further including depositing said adhesion layer at a thickness of less than 100 Å inside features etched into said dielectric material.

10. The method of claim 1 including having said diffusion barrier layer at a thickness of less than 200 Å—inside features etched into said dielectric material.

11. The method of claim 6 further comprising heating said wafer to a temperature of between about 100-400 degrees Celsius during the deposition of said diffusion barrier layer, causing a reaction between exposed dielectric material, said adhesion layer, and said diffusion barrier layer.

12. The method of claim 6 further comprising heating said wafer to a temperature less than about 400 degrees Celsius in a separate chamber following the deposition of the diffusion barrier causing a reaction between exposed dielectric material, said adhesion layer, and said diffusion barrier layer.

13. The method of claim 1 including depositing a conductive metal directly on top of said diffusion barrier layer by electrochemical deposition methods.

14. The method of claim 13 further comprising a copper seed layer directly deposited on top of said diffusion barrier layer by physical vapor deposition, chemical vapor deposition, or electrochemical methods.

15. The method of claim 14 further comprising depositing a copper layer on top of said copper seed layer by electrochemical methods.

16. The method of claim 1 including having said deposition of said adhesion layer followed by a bias-sputter etch.

17. The method of claim 16 wherein said step of bias-sputter etching comprises electrically biasing said wafer in an argon plasma to sputter said adhesion layer on surfaces of said wafer that are perpendicular to said argon ion beam.

18. The method of claim 17 further comprising bombarding said wafer with argon ions in combination with hydrogen, helium, oxygen, or nitrogen.

* * * * *